United States Patent [19]
Kuo

[11] Patent Number: 6,066,966
[45] Date of Patent: May 23, 2000

[54] CONTROL CIRCUIT FOR HALL-EFFECT SWITCHING DEVICE

[75] Inventor: Kuei Wei Kuo, Tainan, Taiwan

[73] Assignee: Analog and Power Electronics Corp., Hsinchu, Taiwan

[21] Appl. No.: 09/124,820

[22] Filed: Jul. 29, 1998

[30] Foreign Application Priority Data

May 4, 1998 [TW] Taiwan ................................. 87106847

[51] Int. Cl.⁷ ..................................................... G01R 19/00
[52] U.S. Cl. ................................. 327/55; 327/67; 327/434
[58] Field of Search ..................................... 327/404, 403, 327/405, 427, 434, 478, 489, 530, 55, 67

[56] References Cited

U.S. PATENT DOCUMENTS

| | | | |
|---|---|---|---|
| 3,912,942 | 10/1975 | Isham ........................................ | 330/33 |
| 4,004,158 | 1/1977 | Morgan ............................... | 307/235 T |
| 4,937,479 | 6/1990 | Hoshi ........................................ | 327/55 |
| 5,017,815 | 5/1991 | Shah et al. ................................ | 327/55 |
| 5,696,726 | 12/1997 | Tsukikawa ................................ | 327/55 |

*Primary Examiner*—Jung Ho Kim
*Attorney, Agent, or Firm*—Christie, Parker & Hale, LLP

[57] ABSTRACT

A control circuit for Hall-effect switching device is provided. The control circuit can be used in a Hall-effect switching device to control the output of the Hall-effect switching device in response to Hall effect. The control circuit comprises a current source and two pairs of symmetrically arranged bipolar junction transistors (BJT). The particular arrangement of the BJTs allow the Hall-effect sensitivity by the Hall-effect switching device to be enhanced. The Hall-effect sensitivity can be adjusted by varying the current source in the control circuit. Moreover, the control circuit is designed with a double-output feature that allows the Hall-effect switching device to be realizable with a fewer number of transistors, allowing the Hall-effect switching device to operate with a lower working current and a lower starting voltage as compared to the prior art, thus considerably reducing power consumption.

10 Claims, 3 Drawing Sheets

CONTROL CIRCUIT FOR HALL-EFFECT SWITCHING DEVICE

CROSS-REFERENCE TO RELATED APPLICATION

This application claims the priority benefit of Taiwan application serial no. 87106847, filed May 4, 1998, the full disclosure of which is incorporated herein by reference.

BACKGROUND OF THE INVENTION

1. Field of the Invention

This invention relates to Hall-effect devices, and more particularly, to a control circuit that can be used in a Hall-effect switching device to control the output of the Hall-effect switching device in response to Hall effect.

2. Description of Related Art

The Hall effect is a well-known principle in the art of electronics and is widely used in the design of many various kinds of electronic devices, such as control devices in DC brushless motors. Since a Hall-effect control device can operate without physical contact with the moving part of the motor, it can allow the motor to be easily controlled without causing mechanical wear.

The principle of Hall effect is briefly described in the following with reference to FIG. 1. As shown, assume a magnetic field B is applied to a current-carrying semiconductor 2 in perpendicular to the flow direction of the current I flow through the semiconductor 2. Then, in the case of the semiconductor 2 being N-type, the positive carriers in the current I will be diverted upwards to the top of the semiconductor 2 while the negative carriers will be diverted downwards to the bottom, thus resulting in a potential difference V from top to bottom in the semiconductor 2; whereas in the case of the semiconductor 2 being P-type, the positive carriers will be diverted upwards to the top while the negative carriers will be diverted downwards to the bottom, thus resulting in a potential difference V from bottom to top in the semiconductor 2. This potential difference is customarily referred to as Hall-effect voltage. The magnitude of the Hall-effect voltage V is proportional to the intensity of the magnetic field B and the magnitude of the electric current I.

FIG. 2 is a schematic block diagram of a conventional Hall-effect switching device that uses a magnetic field to control the ON/OFF states thereof. As shown, the Hall-effect switching device includes a Hall-effect sensor 4, an amplifier 6, a hysteresis generator 8, a first control circuit 10, a second control circuit 12, a first bipolar junction transistor (BJT) IC1, and a second BJT IC2. In operation, the Hall-effect sensor 4 can generate an output signal indicative of the magnitude of a magnetic field B being applied to the switching device. The output signal from the Hall-effect sensor 4 is then amplified by the amplifier 6. In response to the amplified signal from the amplifier 6, the hysteresis generator 8 determines whether the applied magnetic field B is to cause a conducting state or (ON) a non-conducting state (OFF). The outputs from the hysteresis generator 8 are then transferred respectively under the control of the first and second control circuits 10, 12 to the first BJT IC1 and the second BJT IC2, causing the first BJT IC1 to produce a first output signal $V_{out1}$ and the second BJT IC2 to produce a second output signal $V_{out2}$, where $V_{out1}$ and $V_{out2}$ are complementary to each other.

FIG. 3 is a graph showing a hysteresis effect caused by the hysteresis generator 8 utilized in the Hall-effect switching device of FIG. 2. In this graph, the horizontal axis represents the magnitude of the applied magnetic field B (unit: Gauss), while the vertical axis represents the magnitude of the output voltage $V_o$ from the hysteresis generator 8 (unit: volt). As shown, the hysteresis plot has a positive threshold point $B_{op}$ and a negative threshold point $B_{rp}$ on the magnitude of the magnetic field B. When switching from non-conducting state (OFF) to conducting state (ON), the applied magnetic field B should be greater in magnitude than the positive threshold point $B_{op}$ to allow the output voltage $V_o$ to be turned into a high-voltage state, in which can then cause the switching device to be switched to the conducting state (ON). The conducting state (ON) will be maintained unless the applied magnetic field B is reduced to below the negative threshold point $B_{rp}$ where the output voltage $V_o$ will be turned into a low-voltage state (0 V) that can then cause the switching device to be switched to the non-conducting state (OFF).

One drawback to the foregoing Hall-effect switching device of FIG. 2, however, is that it has a poor symmetric relationship between the positive threshold point $B_{op}$ and the negative threshold point $B_{rp}$. The difference of the absolute value of the positive threshold point $B_{op}$ and the absolute value of the negative threshold point $B_{rp}$, i.e., the absolute quantity $\||B_{op}|-|B_{rp}|\|$, is typically greater than 30 G, which is considered too large to allow the switching device to have a high sensitivity in Hall-effect detection.

Moreover, the operating current, which flows through the semiconductor, is above 5 mA (milliampere), the switching device will require a starting voltage of above 4 V to operate, which causes the power consumption to be high. The sensitivity in Hall-effect detection can be raised by reducing the value of $\||B_{op}|-|B_{rp}|\|$. However, this scheme requires a high working current to realize, which causes the power consumption to be further increased.

FIG. 4 is a schematic circuit diagram of a double-output transistor circuit that can generate the two complementary output signals $V_{out1}$ and $V_{out2}$ shown in FIG. 2 in response to the one single output signal from the hysteresis generator 8 (here denoted by $V_t$). The circuit of FIG. 4 represents a realization of the first control circuit 10, the second control circuit 12, the first BJT IC1, and the second BJT IC2 in the Hall-effect switching device of FIG. 2.

In operation, when the input signal $V_t$ is switched into high-voltage state, it will cause the first BJT IC1 to be switched into conducting state, thereby causing the second output signal $V_{out2}$ to take on the ground voltage (i.e., a low-voltage logic state). Meanwhile, it also causes the gate voltage of the second BJT IC2 to take on the ground voltage, thereby causing the second BJT IC2 to be switched into non-conducting state, thus allowing the first output signal $V_{out1}$ to take on the system voltage $V_{dd}$ (i.e., a high-voltage logic state).

On the other hand, when the input signal $V_t$ is switched into low-voltage state, it will cause the first BJT IC1 to be switched into non-conducting state, thereby causing the second output signal $V_{out2}$ to take on the system voltage $V_{dd}$ (i.e., a high-voltage logic state). Meanwhile, it also causes the gate voltage of the second BJT IC2 to take on the system voltage $V_{dd}$, thereby causing the second BJT IC2 to be switched into conducting state, thus allowing the first output signal $V_{out1}$ to take on the ground voltage (i.e., a low-voltage logic state).

One drawback to the foregoing double-output transistor circuit, however, is that the generation of the two output signals $V_{out1}$ and $V_{out2}$ requires two transistors, i.e., the first BJT IC1 and the second BJT IC2, to realize, which not only causes the overall power consumption by the switching device to be high, but also requires a large circuit layout area to implement.

SUMMARY OF THE INVENTION

It is therefore an objective of the present invention to provide a control circuit for Hall-effect switching device, which has an improved symmetric characteristic in the positive and negative threshold points of the applied magnetic field that allows the Hall-effect switching device to have increased sensitivity while nonetheless being operable with a low working current and a low starting voltage for low power consumption.

It is another objective of the present invention to provide a control circuit for Hall-effect switching device, which is operable without having two use a double-output transistor circuit, so that the circuit layout space and power consumption can be both reduced as compared to the prior art.

In accordance with the foregoing and other objectives of the present invention, a new control circuit for Hall-effect switching device is provided. The control circuit of the invention has two input ports and two output ports and includes the following constituent circuit elements: a first BJT whose collector is connected to the first output port; whose emitter is connected to a common node; and whose base is connected to the second input port; a second BJT whose collector is connected to the first input port; whose emitter is connected to the common node; and whose base is connected to the second input port; a third BJT whose collector is connected to the second input port; whose emitter is connected to the common node; and whose base is connected to the first input port; a fourth BJT whose collector is connected to the second output port; whose emitter is connected to the common node; and whose base is connected to the first input port; and a current source having a positive end connected to the common node and a negative end connected to the ground.

In the foregoing control circuit, the particular arrangement of the BJTs allow the sensitivity of the magnetic detection by the Hall-effect switching device to be enhanced. Moreover, the control circuit is designed with a double-output feature that allows the Hall-effect switching device to be realized with a fewer number of transistors which can operate with a lower working current and a lower starting voltage as compared to the prior art, considerably reducing power consumption by the Hall-effect switching device. The sensitivity of the magnetic detection can be adjusted by varying the current source in the control circuit.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 5:
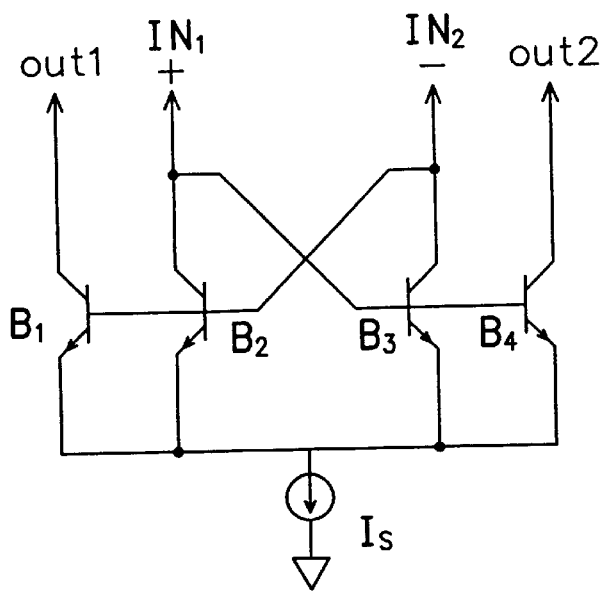
FIG. 5 is a schematic circuit diagram of the control circuit according to the invention for use in a Hall-effect switching device.

FIG. 5 is a schematic circuit diagram of the control circuit according to the invention for use in a Hall-effect switching device.

As shown, the control circuit of the invention includes a current source $I_S$ and four transistors, for example, four bipolar junction transistors (BJT): a first BJT B1, a second BJT B2, a third BJT B3, and a fourth BJT B4, and which has two input ports IN1, IN2 and two output ports OUT1, OUT2.

The first BJT B1 is connected in such a manner that its collector is connected to the first output port OUT1; its emitter is connected to the positive end of the current source $I_S$; and its base is connected to the second input port IN2.

The second BJT B2 is connected in such a manner that its collector is connected to the first input port IN1; its emitter is connected to the positive end of the current source $I_S$; and its base is connected to the second input port IN2 (which is also connected to the base of the first BJT B1).

The third BJT B3 is connected in such a manner that its collector is connected to the second input port IN2; its emitter is connected to the positive end of the current source $I_S$; and its base is connected to the first input port IN1.

The fourth BJT B4 is connected in such a manner that its collector is connected to the second output port OUT2; its emitter is connected to the positive end of the current source $I_S$; and its base is connected to the first input port IN1 (which is also connected to the base of the third BJT B3).

The current source $I_S$ is connected in such a manner that its positive end is connected to the emitter of each of the BJTs B1, B2, B3, B4; and its negative end is connected to the ground.

Figure 4:
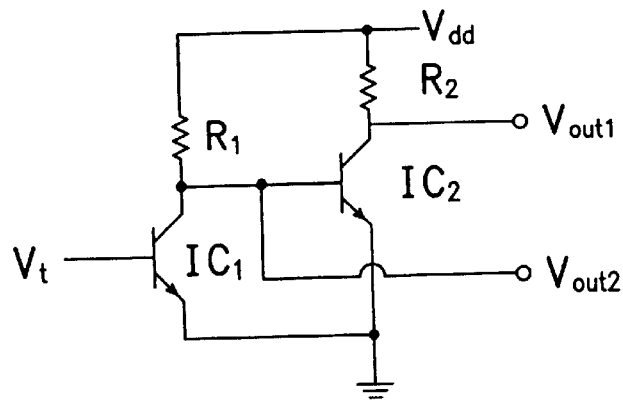
FIG. 4 is a schematic circuit diagram of a conventional double-output transistor circuit utilized in the Hall-effect switching device of FIG. 2.

In the foregoing control circuit, the second BJT B2 and the third BJT B3 are arranged in a symmetric manner that allows a current latching effect and a hysteresis effect to the input signals. The hysteresis effect, in particular, can reduce the quantity $\|B_{op}\|-\|B_{rp}\|$ to below 30 G, which is a considerable improvement over the prior art. Moreover, this control circuit can operate with a working current of 3 mA and a starting voltage of 2.5 V, considerably less than those in the prior art. Still moreover, since this control circuit is designed to have two output ports, the double-output transistor circuit as shown in FIG. 4 is not required.

Figure 6:
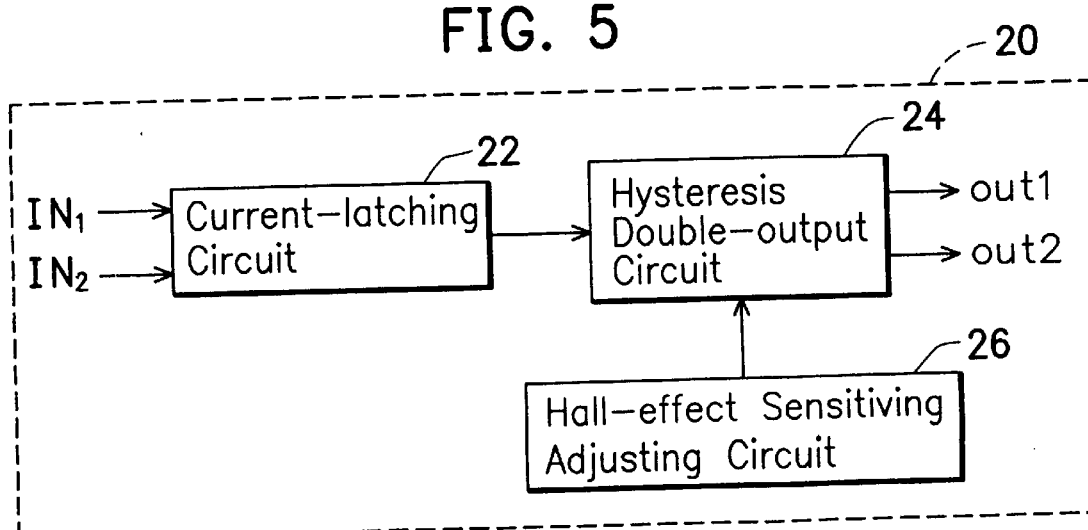
FIG. 6 shows a block diagram representation of the control circuit of FIG. 5.

Broadly speaking, the foregoing control circuit of FIG. 5 can be generalized and represented by a block diagram shown in FIG. 6. Any person skilled in the art will know that the bipolar junction transistors (BJT) as shown in FIG. 5 can be easily replaced with other kind of transistors, such as metal oxide semiconductor transistor (MOS). As shown, the block diagram of the control circuit of the invention includes a current-latching circuit 22, a hysteresis double-output circuit 24, and a Hall-effect sensitivity adjusting circuit 26. In reference to the detailed circuit diagram of FIG. 5, the current-latching circuit 22 and the hysteresis double-output circuit 24 are realized together by the second and third BJTs B2, B3 in the control circuit of FIG. 5; the Hall-effect sensitivity adjusting circuit 26 is realized by the current source $I_S$; and the outputs OUT1 and OUT2 are realized by the first and fourth BJTs B1, B4.

Figure 7A:
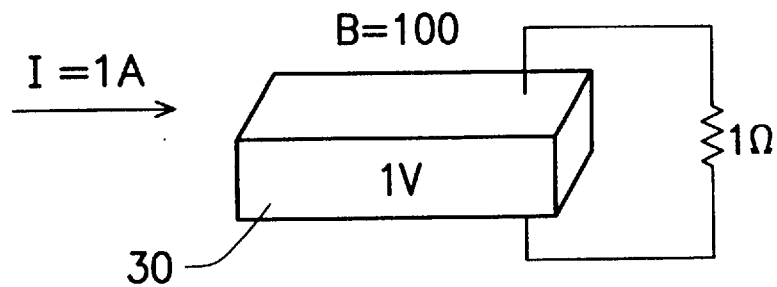
FIGS. 7A–7B are schematic diagrams used to depict how the sensitivity of the Hall-effect switching device can be adjusted by varying a current source in the control circuit of the invention.
Figure 7B:
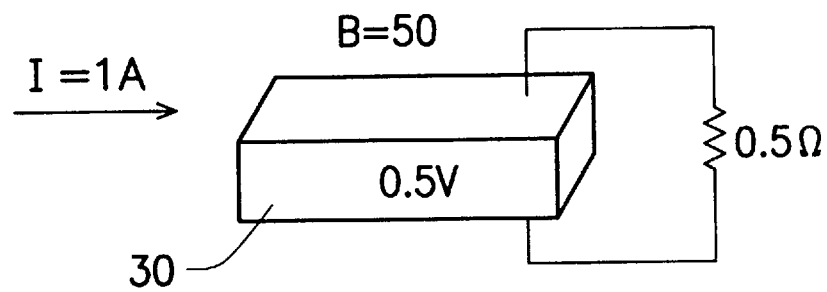

FIGS. 7A–7B are schematic diagrams used to depict how the Hall-effect sensitivity can be adjusted by varying the current source $I_S$ in the control circuit of the invention.

Referring first to FIG. 7A, assuming that the input current to the semiconductor 30 is I=1 A (ampere), the magnetic field B in the semiconductor 30 is 100 G, and the resulted Hall-effect voltage is 1 V. Then, if a resistor of 1 Ω connected across the two sides of the semiconductor 30 where the Hall-effect voltage is produced, then the current flowing through this resistor will be 1 A. If the magnetic field B is reduced to 50 G, the current flow through the resistor is then reduced to 0.5 A.

In the invention, referring next to FIG. 7B, if the magnetic field B is reduced to 50 G, the resistor can be simultaneously reduced to 0.5 Ω, then even though the Hall-effect voltage is reduced to 0.5 V, the current flowing through the resistor is nonetheless 1 A. This can be used to adjust the Hall-effect sensitivity. Therefore, the power consumption will not be increased even through the current I is increased.

Figure 8:
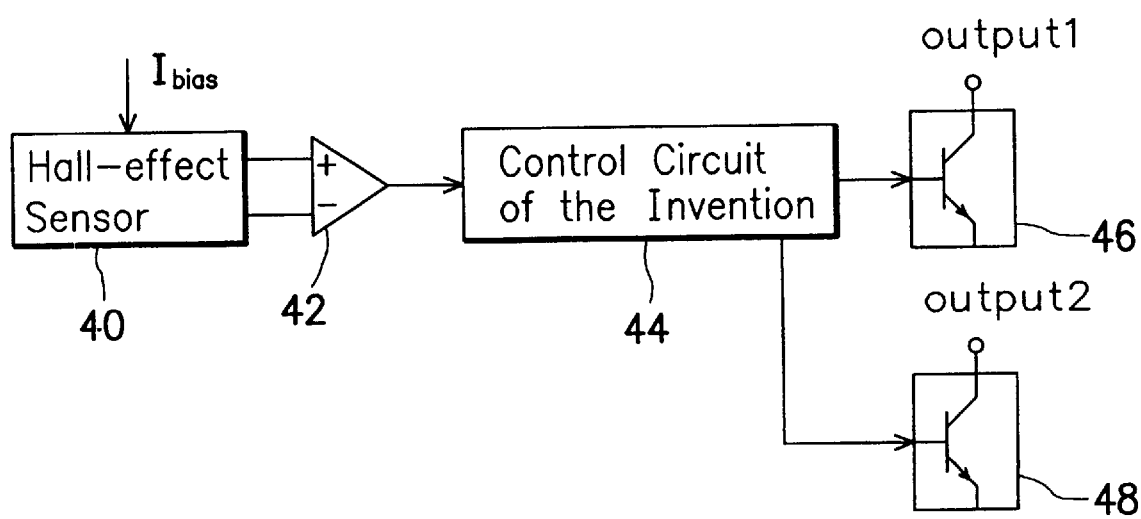
FIG. 8 is a schematic block diagram of a Hall-effect switching device utilizing the control circuit of the invention.

FIG. 8 is a schematic block diagram of a Hall-effect switching device utilizing the control circuit of the invention. The control circuit of the invention is here designated by the reference numeral 44, the same circuit as shown in FIG. 5. In addition to the control circuit 44, this Hall-effect switching device further includes a Hall-effect sensor 40, an amplifier 42, a first BJT 46, and a second BJT 48, which are all identical in function as the Hall-effect sensor 4, the amplifier 6, the first BJT IC1, and the second BJT IC2 shown in the prior art of FIG. 2, so description thereof will not be further detailed. Compared to FIG. 2, it can be seen that the control circuit of the invention 20 is intended to replace the hysteresis generator 8, the first control circuit 10, and the second control circuit 12 in the prior art of FIG. 2.

It can be learned from the foregoing disclosure that the control circuit of the invention is characterized in the provision of two pairs of symmetrically arranged BJTs for current latching and hysteresis production, which can operate with a reduced working current and a reduced starting voltage, allowing the power consumption to be considerably lowered.

Figure 1:
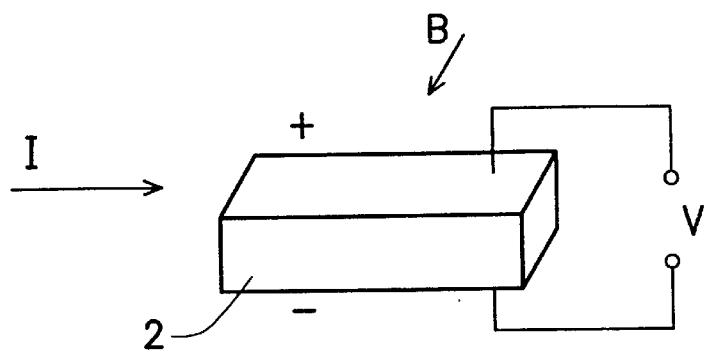
FIG. 1 is a schematic diagram used to depict the Hall effect.
Figure 2:
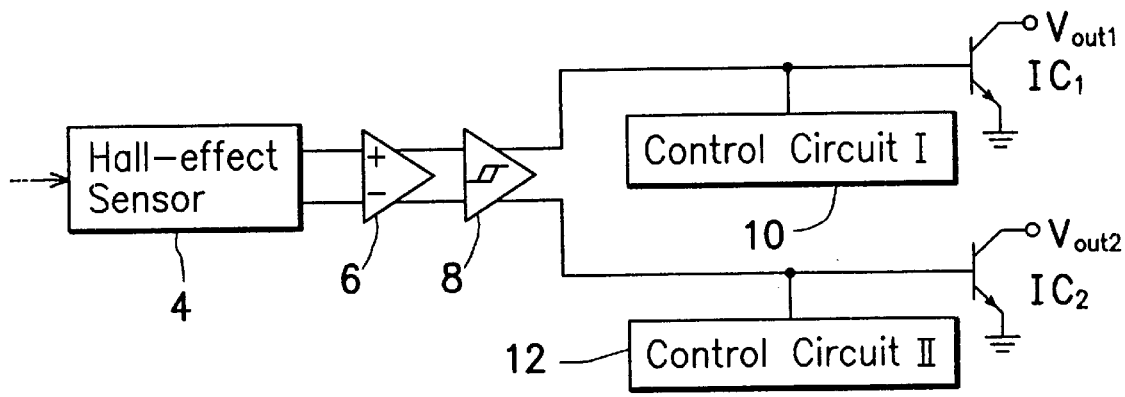
FIG. 2 is a schematic block diagram of a conventional Hall-effect switching device.
Figure 3:
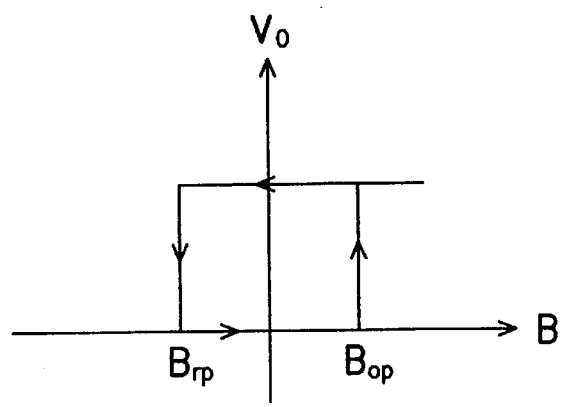
FIG. 3 is a graph showing a hysteresis effect caused by the hysteresis generator utilized in the Hall-effect switching device of FIG. 2.

Moreover, the control circuit of the invention is characterized in the provision of a double-output feature that allows the required layout area for the transistors to be considerably reduced (about one-third as compared to the prior art of FIG. 2).

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A control circuit for use in a Hall-effect switching device, which comprises:

a current-latching circuit having a first input port and a second input port, generating a latching current in response to a pair of input signals received respectively via the first and second input ports from the switching device wherein said current-latching circuit includes a pair of symmetrically arranged BJTs, with one BJT being connected in such a manner that its collector is connected to the first input port, its emitter is connected to a current source, and its base is connected to the second input port and the other BJT being connected in such a manner that its collector is connected to the second input port, its emitter is connected to the current source, and its base is connected to the first input port;

a hysteresis double-output circuit having a first output port and a second output port, generating a pair of complementary output signals at the first and second output ports in response to the latching current from the current-latching circuit; and a Hall-effect sensitivity adjusting circuit which is the current source and varies the hystersis effect caused by the hysteresis double-output circuit to thereby adjust the Hall-effect sensitivity of the switching device.

2. The control circuit of claim 1, wherein the hysteresis double-output circuit comprises:

a pair of symmetrically arranged BJTs, with one BJT being connected in such a manner that its collector is connected to the first output port, its emitter is connected to the current source, and its base is connected to the second input port; and the other BJT being connected in such a manner that its collector is connected to the second output port, its emitter is connected to the current source, and its base is connected to the first input port.

3. The control circuit of claim 1, wherein the current-latching circuit includes:

a pair of symmetrically arranged transistors, with one transistor being connected in such a manner that one of its source/drain regions is connected to the first input port, the other of its source/drain regions is connected to the current source, and its gate is connected to the second input port; and the other transistor being connected in such a manner that one of its source/drain regions is connected to the second input port, the other of its source/drain regions is connected to the current source, and its gate is connected to the first input port.

4. The control circuit of claim 3, wherein the hysteresis double-output circuit comprises:

a pair of symmetrically arranged transistors, with one transistor being connected in such a manner that one of its source/drain regions is connected to the first output port, the other of its source/drain regions is connected to the current source, and its gate is connected to the second input port; and the other transistor being connected in such a manner that one of its source/drain regions is connected to the second output port, the other of its source/drain regions is connected to the current source, and its gate is connected to the first input port.

5. A control circuit for use in a Hall-effect switching device, which comprises:

a first input port, for receiving a first input signal from the switching device;

a second input port, for receiving a second input signal from the switching device;

a first output port, for outputting a first output signal in response to the first and second input signals;

a second output port, for outputting a second output signal in response to the first and second input signals;

a first transistor, wherein the transistor comprises a first gate and a pair of first source/drain regions, wherein one of the first source/drain regions is connected to the first output port;

a second transistor, wherein the second transistor comprises a second gate and a pair of second source/drain regions, wherein one of the second source/drain regions is connected to the first input port, the second gate is connected to the first gate of the first transistor;

a third transistor, wherein the third transistor comprises a third gate and a pair of third source/drain regions, wherein one of the third source/drain regions is connected to the second input port and the second gate of the second transistor, the third gate is connected to the first input port;

a fourth transistor, wherein the forth transistor comprises a fourth gate and a pair of fourth source/drain regions, wherein one of the fourth source/drain regions is connected to the second output port, the fourth gate is connected to the third gate of the third transistor; and a current source having a positive end and a negative end, wherein the positive end is connected to the unconnected first source/drain region of the first transistor, second source/drain region of the second transistor, third source/drain region of the third transistor and fourth source/drain region of the fourth transistor, wherein the negative end is connected to the ground.

6. A control circuit for use in a Hall-effect switching device, which comprises:

a first input port for receiving a first input signal from the switching device;

a second input port for receiving a second input signal from the switching device;

a first output port for outputting a first output signal in response to the first and second input signals;

a second output port for outputting a second output signal in response to the first and second input signals;

a first BJT whose collector is connected to the first output port; whose emitter is connected to a common node; and whose base is connected to the second input port;

a second BJT whose collector is connected to the first input port; whose emitter is connected to the common node; and whose base is connected to the second input port;

a third BJT whose collector is connected to the second input port; whose emitter is connected to the common node; and whose base is connected to the first input port;

a fourth BJT whose collector is connected to the second output port; whose emitter is connected to the common node; and whose base is connected to the first input port; and a current source having a positive end connected to the common node and a negative end connected to the ground.

7. A control circuit for use in a Hall-effect switching device, which comprises:

a current-latching circuit having a first input port and a second input port, generating a latching current in response to a pair of input signals received respectively via the first and second input ports from the switching device;

a hystersis double-output circuit having a first output port and a second output port, generating a pair of complementary output signals at the first and second output ports in response to the latching current from the current-latching circuit; and a Hall-effect sensitivity adjusting circuit which can vary the hystersis effect caused by the hysteresis double-output circuit to thereby adjust the Hall-effect sensitivity of the switching device;

wherein the Hall-effect sensitivity adjusting circuit is located just before a system ground node, whereby the current-latching circuit and the hysteresis double-output circuit are also coupled to the system around through the Hall-effect sensitivity adjusting circuit.

8. The control circuit of claim 7, wherein the Hall-effect sensitivity adjusting circuit is a current source.

9. The control circuit of claim 8, wherein the current-latching circuit includes:

a pair of symmetrically arranged BJTs, with one BJT being connected in such a manner that its collector is connected to the first input port, its emitter is connected to the current source, and its base is connected to the second input port; and the other BJT being connected in such a manner that its collector is connected to the second input port, its emitter is connected to the current source, and its base is connected to the first input port.

10. The control circuit of claim 9, wherein the hysteresis double-output circuit comprises:

a pair of symmetrically arranged BJTs, with one BJT being connected in such a manner that its collector is connected to the first output port, its emitter is connected to the current source, and its base is connected to the second input port; and the other BJT being connected in such a manner that its collector is connected to the second output port, its emitter is connected to the current source, and its base is connected to the first input port.

* * * * *